(12) United States Patent
Kinanen

(10) Patent No.: US 6,335,670 B1
(45) Date of Patent: Jan. 1, 2002

(54) MRI SYSTEM WITH SPLIT ROSE RING WITH HIGH HOMOGENEITY

(75) Inventor: Ilmari Kinanen, Päivänkehräntie (FI)

(73) Assignee: Marconi Medical Systems Finland, Inc.

( * ) Notice: Subject to any disclaimer, the term of this patent is extended or adjusted under 35 U.S.C. 154(b) by 0 days.

(21) Appl. No.: 09/549,852

(22) Filed: Apr. 14, 2000

(51) Int. Cl.[7] .............................. H01F 1/00; H01F 3/00; H01F 7/00
(52) U.S. Cl. .................. 335/296; 335/297; 324/319
(58) Field of Search .................. 335/216, 296–306; 324/318, 319, 320

(56) References Cited

U.S. PATENT DOCUMENTS

| 4,710,741 A | 12/1987 | McGinley ............... 335/296 |
| 4,766,378 A | 8/1988 | Danby et al. ............ 324/307 |
| 5,162,768 A | 11/1992 | McDougall et al. ...... 335/296 |
| 5,194,810 A * | 3/1993 | Breneman et al. ........ 324/319 |
| 5,436,607 A | 7/1995 | Chai et al. .............. 335/216 |
| 5,647,361 A | 7/1997 | Damadian ............. 128/683.2 |
| 5,883,558 A | 3/1999 | Laskaris et al. .......... 335/216 |
| 6,172,588 B1 * | 1/2001 | Laskaris et al. .......... 335/299 |

* cited by examiner

Primary Examiner—Ramon M. Barrera
(74) Attorney, Agent, or Firm—Fay, Sharpe, Fagan, Minnich & McKee, LLP

(57) ABSTRACT

A pair of pole assemblies (12, 14) are disposed on opposite sides of an examination region (10). A ferrous flux return path includes an overhead ferrous structure (18) above the upper pole assembly and a lower ferrous structure (20) adjacent to the lower pole assembly. The pole assemblies include a Rose ring assembly (34) having axially spaced segments (40, 42) with an axial gap (44) in between. Magnetic attractive forces between an annular magnet (30) and the Rose ring urge the Rose ring and the magnet into an axially centered alignment. The magnet of the upper pole piece assembly (12) is attracted toward the overhead ferrous structure (18) and toward the lower pole piece assembly (14), as well as toward the Rose ring. The magnet is also positioned such that the magnetic attractive forces between the magnet and the Rose ring dominate magnetic attractive forces between the overhead ferrous structure and the magnet. In this manner, the magnet is subject to a net force toward an axially balanced position, such that the force does not change sign during ramp up and ramp down.

15 Claims, 2 Drawing Sheets

MRI SYSTEM WITH SPLIT ROSE RING WITH HIGH HOMOGENEITY

BACKGROUND OF THE INVENTION

The present invention relates to the resonance magnetic arts. It finds particular application in conjunction with diagnostic imaging at surgical sites and will be described with particular reference thereto. However, it is to be appreciated that the invention will also find application in other magnetic imaging, spectroscopy, and therapy applications.

Early magnetic resonance imaging systems were based on solenoid magnets, A series of annular magnets were placed around the bore through which a magnetic field was generated longitudinally. A patient was selectively moved axially along a horizontal axis of the bore to be positioned for imaging. Magnetic resonance imaging systems with solenoid magnets tended to be claustrophobic. Moreover, access to the subject for surgical procedures, minimally invasive procedures, physiological tests, equipment access, and the like was limited and awkward.

To provide for patient access and reduce the claustrophobic effects, open or vertical field magnets have been devised. Open magnets typically include an upper pole, a lower pole, and a ferrous flux path connecting them. The ferrous flux path is typically in the form of a C, an H, a four poster arrangement, ferrous plates in ceilings and walls, or the like. Although less energy efficient, the magnetic flux can return through the air or through other constructions with less magnetic susceptibility than a ferrous return path.

In order to improve the homogeneity of magnetic flux through the gap between the pole pieces, various constructions have been provided at the poles. Typically, each pole includes a large ferrous pole piece which may be shaped or contoured to improve magnetic flux uniformity. Typically, a heavy ferrous ring, known as a Rose ring, was positioned around the circumference of the pole piece, often extending beyond the pole piece towards the patient to drive the magnetic flux towards the central axis of the patient receiving gap. The magnet is often positioned offset toward the flux return path form the Rose ring.

Typically, a super-conducting magnet has been provided at each pole. In the presence of a magnetic field, the pole pieces, Rose ring, and super-conducting magnets attracted towards each other with a significant force. It has been found that when this pole assembly is spaced from the ferrous return path, there is an opposite attraction toward the ferrous return path. Balancing or zeroing the forces on the pole assembly permits lighter weight constructions to be used to support the pole assemblies. However, the present inventors have found that when magnets ramp up and ramp down, the ramping process is not linear. Rather, during a typical ramp up period, the pole assemblies will at times be attracted toward each other and at other times be attracted toward the ferrous flux return path. This oscillation between opposite forces tends to fatigue and stress the support assembly.

Another disadvantage of placing the coil at the axially position of balanced force is that the axial force changes with changes in the field. When the coil is shifted from the balanced force position, the force to increase the shift grows rapidly. This creates a tendency for a small vibrational shift to cascade into catastrophic shift forces. To control and avoid such a runaway situation, the coil supports are constructed with very high stiffness.

In the prior art coils, the Rose ring was typically shifted axially relative to the coil. With the Rose ring positioned closer to the subject than the coil, the Rose ring tends to saturate with increasing field. This change in Rose ring saturation, again causes changes in the relative force balance.

This application provides a new and improved magnetic resonance imaging system which overcomes the above referenced problems and others.

SUMMARY OF THE INVENTION

In accordance with one aspect of the present invention, a magnetic resonance system includes a pair of pole assemblies disposed on opposite sides of an examination region. At least one of the pole assemblies includes an annular magnet and an annular Rose ring assembly disposed concentrically within the annular magnet. The annular magnet is mounted such that it is axially centered relative to the Rose ring assembly.

In accordance with another aspect of the present invention, a magnetic resonance system includes a magnetic field source which generates a magnetic field axially through an examination region. A Rose ring is disposed adjacent the examination region and positioned such that the magnetic field extends axially through the Rose ring. The Rose ring includes at least two axially displaced Rose ring segments.

In accordance with another aspect of the present invention, a magnetic resonance method is provided. A magnetic field is induced axially through an examination region. The homogeneity of the magnetic field is improved with an annular Rose ring having a plurality of axially separated Rose ring segments surrounding the magnetic field.

One advantage of the present invention is that it facilitates the design of open magnets with stronger magnetic fields.

Another advantage of the present invention is that it improves magnetic field homogeneity.

Yet another advantage of the present invention is that it improves structural stability.

Yet another advantage resides in the low forces on driver coils.

Still further advantages and benefits of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not be construed as limiting the invention.

DETAILED DESCRIPTION OF THE PREFERRED EMBODIMENTS

Figure 1:
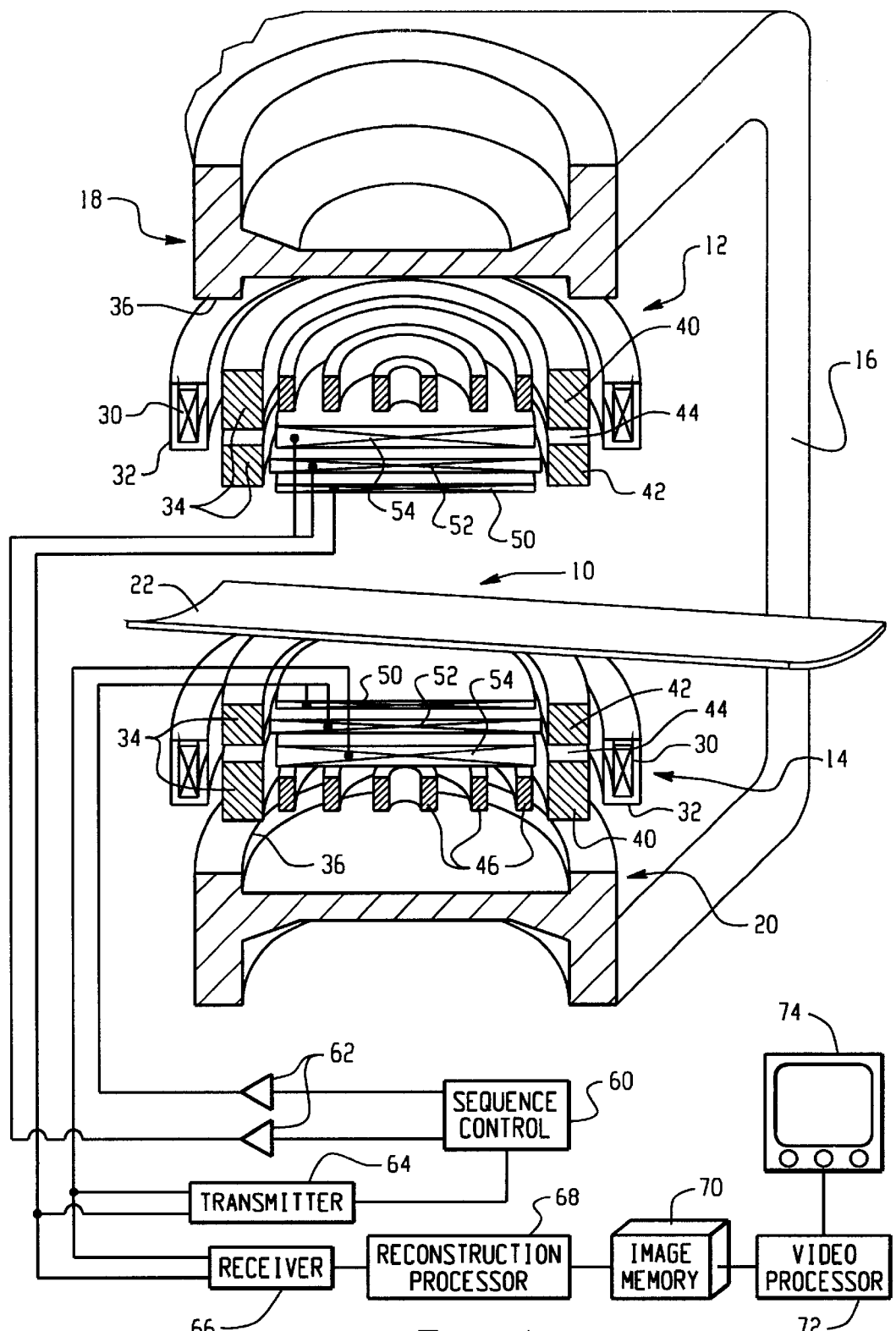
FIG. 1 is a perspective view in partial section of a magnetic resonance imaging system in accordance with the present invention.

With reference to FIG. 1, a patient receiving region 10 is defined between an upper pole assembly 12 and a lower pole assembly 14. A ferrous flux return path 16 extends between a circular upper ferrous structure 18 disposed adjacent but displaced from the upper pole assembly 12 and a lower ferrous structure 20 disposed adjacent to but displaced from the lower pole assembly 14. Non-ferrous structural mounting elements (not shown) interconnect the upper pole assembly with the upper ferrous structure and the lower pole piece with the lower ferrous structure. A patient support surface 22 is supported adjacent the lower pole assembly for supporting a patient in the examination region 12. The patient support surface 22 is preferably movable into and out of the patient examination region 10 such that patients can be loaded and unloaded displaced from the pole assemblies.

In the preferred embodiment, the pole assemblies 10, 12 are of the same construction and are mirror image symmetric about a horizontal plane through the examination region. Each includes an annular super-conducting magnet 30 suspended in a helium can 32. A Rose ring assembly 34 is mounted inside the magnet axially symmetric relative to the magnet. Due to this axial symmetry, the natural magnetic attraction between the magnet and the Rose ring such that the magnet is urged to center itself axially on the Rose ring. In this manner, if the magnet should be shifted axially relative to the Rose ring, the natural magnetic interaction between the magnet and the Rose ring draws the magnet back toward the center position on the Rose ring. The magnet 30 is positioned closer to the Rose ring than to a lip 36 on the bottom edge of the top and bottom ferrous structures such that the magnetic interaction forces between the magnet 30 and the lip 36 are significantly smaller than the magnetic interactive interaction forces between the magnet and the Rose ring assembly 34.

In order to limit saturation of the Rose ring, the Rose ring includes an outer, more massive portion 40 away from the examination region, an inner portion 42 closer to the examination region, and a gap 44 therebetween. In the preferred embodiment, the gap 44 is an air gap on the order of 10–15 mm. Optionally, other non-ferromagnetic materials may be disposed in the gap. Splitting the Rose ring increases the uniformity of the magnetic flux density across the Rose ring.

A plurality of annular ferrous and permanent magnet shim rings 46 are mounted inside the Rose ring. The exact positioning, size, and spacing of the rings and, if permanent magnets their polarity, is selected to optimize uniformity of the magnetic field in the examination region 10. Preferably, four concentric iron rings are positioned to shim the spherical harmonics to a homogeneity of better than 5–20 ppm in the imaging volume. Preferably, these rings are made of silicon iron (SiFe) sheet wound into cylinders to reduce magnetic hysteresis effects of gradient coil pulses. The ferrous shim rings 46 are mounted in supporting structure, preferably a non-ferrous supporting structure, such as fiber reinforced epoxy, aluminum, or the like.

Radio frequency excitation and receive coils 50 are disposed adjacent the imaging volume. Of course, other radio frequency coil constructions, such as surface coil or localized coils mounted directly to appropriate portions of the patient support, mounted in the patient support 22, and mounted to the patient are also contemplated.

Primary gradient magnetic field coils 52 are disposed behind the radio frequency coil. In the illustrated embodiment, the gradient coil 52 is mounted in front of the shim rings 46 and a shield gradient coil 54 is mounted behind the primary gradient coil. Optionally, both portions of the gradient coil may be mounted in front of or behind the shim rings.

In operation, a sequence control circuit 60 controls gradient coil amplifiers 62 and a transmitter 64 in accordance with a preselected magnetic resonance imaging sequence. The control circuit causes the transmitter to send radio frequency signals to the radio frequency coil 50 to induce magnetic resonance in tissue or other dipoles in the imaging volume 10. Additional radio frequency signals are typically sent to manipulate the magnetic resonance. Gradient current pulses from the gradient coil amplifiers to the gradient coils and the shield coils to induce magnetic field gradients as are required by a conducted imaging sequence. The radio frequency coils 50 or localized radio frequency coils and a radio frequency receiver 66 receive and demodulate the induced magnetic resonance signals. The received magnetic resonance signals are reconstructed by a reconstruction processor 68, preferably using a two-dimensional inverse Fourier transform algorithm, into an electronic image representation for storage in an image memory 70. A video processor 72 under the control of an operator control panel withdraws selected portions of the reconstructed image representation and converts them into appropriate format for display on a video, LCD, active matrix, or other human viewable monitor 74.

Figure 2:
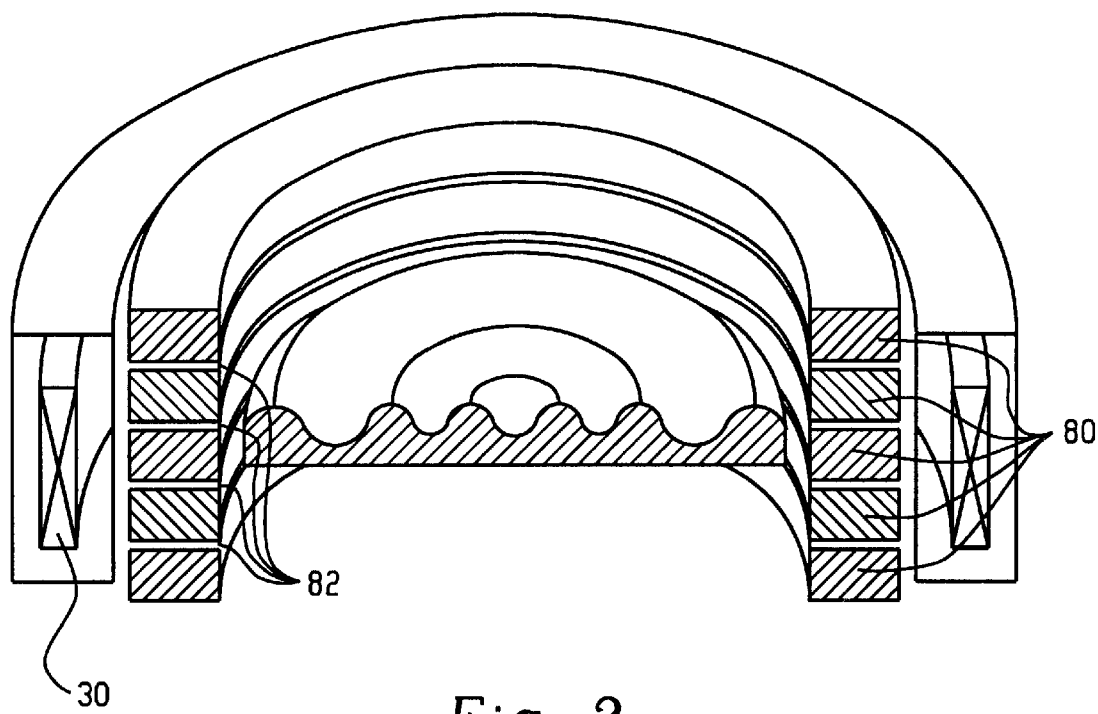
FIG. 2 is a sectional view of an alternate pole assembly for the system of FIG. 1.

With reference to FIG. 2, the Rose ring 34 can have more than two segments. In the embodiment of FIG. 2, the Rose ring includes a multiplicity of ferrous discs 80 separated by thin gaps or layers of dielectric material 82. The layers of dielectric material may be a series of thin annular discs. Alternately, dielectric coatings on the ferrous discs may provide the thin, controlled gaps 82.

The invention has been described with reference to the preferred embodiments. obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A magnetic resonance system including a pair of pole assemblies disposed on opposite sides of an examination region, at least one of the pole assemblies including:
    an annular magnet;
    an annular Rose ring assembly including at least two annular Rose ring segments separated by a non-ferromagnetic region, the Rose ring assembly being disposed concentrically within the annular magnet, the annular magnet being mounted such that it is axially centered relative to the Rose ring assembly.

2. The magnetic resonance system as set forth in claim 1 wherein the two Rose ring segments are separated by a region with the susceptibility of 10–15 mm of air.

3. The magnetic resonance system as set forth in claim 1 wherein the Rose ring includes:
    a multiplicity of stacked annular ferromagnetic discs separated by non-ferromagnetic separations.

4. The magnetic resonance system as set forth in claim 3 wherein the ferromagnetic discs are separated by dielectric layers.

5. A magnetic resonance system comprising:
    an annular magnet;
    an annular Rose ring assembly disposed concentrically within the annular magnet, the annular magnet being mounted such that it is axially centered relative to the Rose ring assembly;
    an upper pole assembly; and
    an overhead ferrous structure disposed axially above the annular magnet and the Rose ring, the magnet being disposed sufficiently closer to the Rose ring than the overhead ferrous structure that magnetic attraction forces between the magnet and the Rose ring dominate magnetic forces between the magnet and the overhead ferrous structure.

6. The magnetic resonance apparatus system as set forth in claim 5 further including:
   a lower ferrous structure disposed below a lower pole assembly; and
   a ferrous flux return path extending between the overhead and lower ferrous structures.

7. The magnetic resonance system as set forth in claim 5 further including a plurality of annular shim rings constructed of one of a ferromagnetic material and a permanent magnetic material mounted concentrically within the Rose ring assembly.

8. A magnetic resonance system including:
   an annular magnet;
   an annular Rose ring assembly disposed concentrically within the annular magnet, the annular magnet being mounted such that it is axially centered relative to the Rose ring assembly;
   a radio frequency coil mounted adjacent the examination region within the Rose ring assembly;
   a gradient magnetic field coil for creating magnetic field gradients across the examination region mounted within the Rose ring assembly;
   a sequence control processor for controlling a magnetic resonance imaging sequence;
   gradient amplifiers which operate under control of the sequence control processor to cause the gradient magnetic field coils to generate magnetic field gradient pulses;
   a radio frequency transmitter operated under the control of the sequence control processor to cause the radio frequency coil to generate radio frequency pulses;
   a radio frequency receiver for receiving and demodulating magnetic resonance signals emanating from the examination region; and
   a reconstruction processor which deconstructs the modulated magnetic resonance signals into an image representation.

9. A magnetic resonance system comprising:
   a Rose ring including at least two axially displaced Rose ring segments disposed adjacent an examination region;
   an annular magnet extending peripherally around the Rose ring which generates a magnetic field axially through the Rose ring and the examination region, the magnet being axially centered on the Rose ring, such that magnetic attractive forces between the Rose ring and the magnet pull the Rose ring and the magnet into an axially centered alignment.

10. A magnetic resonance system comprising:
   an annular magnet which generates a magnetic field axially through an examination region;
   a Rose ring disposed adjacent the examination region, the Rose ring including:
      a multiplicity of stacked, axially spaced annular discs.

11. A magnetic resonance system comprising:
   an annular cryogenic magnet which generates a magnetic field axially through an examination region, the annular magnet being disposed above the examination region;
   a Rose ring which is split axially into parts separated by an annular non-ferromagnetic region and disposed above the examination region adjacent the annular magnet;
   a non-cryogenic overhead ferrous structure disposed axially above and separated from the annular magnet and the Rose ring, the annular magnet being disposed sufficiently closer to the rose ring than the overhead ferrous structure that magnetic attraction forces between the annular magnet and the Rose ring dominate magnetic forces between the magnet and the overhead ferrous structure.

12. The magnetic resonance system as set forth in claim 11 further including:
   a plurality of annular shim rings which are non-integral with the overhead ferrous structure disposed concentrically with the Rose Ring and the magnet, the annular shim rings each being at least one of ferromagnetic and permanently magnetic.

13. A magnetic resonance method comprising:
   inducing a magnetic field axially through an examination region with an annular magnet;
   improving homogeneity of the magnetic field with an annular Rose ring disposed concentrically and axially centered within the annular magnet, the Rose ring having a plurality of axially separated Rose ring segments surrounding the magnetic field.

14. A magnetic resonance method comprising:
   inducing a magnetic field axially through an examination region with an annular magnet surrounding a Rose ring, the Rose ring comprising a plurality of axially separated segments disposed concentrically within the annular magnet, a ferrous structure being disposed adjacent and displaced from the Rose ring and the annular magnet;
   positioning the annular magnet relative to the Rose ring and the ferrous structure such that magnetic attractive forces between the magnet and the Rose ring dominate magnetic attractive forces between the magnet and the ferrous structure and such that the magnetic attractive forces between the Rose ring and the magnet urge the magnet and the Rose ring into an axially centered alignment.

15. The method as set forth in claim 14 further including:
   inducing magnetic field gradients across the examination region;
   applying radio frequency pulses to excite magnetic resonance in dipoles in the examination region;
   receiving and demodulating resonance signals from resonating dipoles in the examination region;
   reconstructing the demodulated resonant signals into an image representation.

* * * * *